United States Patent [19]

DeChiaro et al.

[11] Patent Number: 5,116,767
[45] Date of Patent: May 26, 1992

[54] SEMICONDUCTOR LASER PASSIVATION AND OVERSTRESSING

[75] Inventors: Louis F. DeChiaro, Lanoka Harbor; Claude J. Sandroff, Tinton Falls, both of N.J.

[73] Assignee: Bell Communications Research, Inc., Livingston, N.J.

[21] Appl. No.: 754,740

[22] Filed: Sep. 9, 1991

[51] Int. Cl.$^5$ .................... H01L 21/00; H01L 21/66
[52] U.S. Cl. .......................................... 437/7; 437/8; 148/DIG. 95
[58] Field of Search ................ 437/7, 8; 148/DIG. 95

[56] References Cited

U.S. PATENT DOCUMENTS 4,751,200  6/1988  Gmitter et al. .................... 437/225
4,751,201  6/1988  Nottenburg et al. ............... 437/225

OTHER PUBLICATIONS

S. P. Sim et al., "Reliability testing of opto-electronic components," *British Telecommunications Technology Journal*, 1986, vol. 4, pp. 104-113.

O. Ueda, "Degradation of III-V Opto-Electronic Devices," *Journal of the Electrochemical Society*, 1988, vol. 135, pp. 11C-21C.

J. A. F. Peek, "Water Vapor, Facet Erosion, and the Degradation of (Al,Ga)As DH Lasers Operated at CW Output Powers of Up to 3mW/$\mu$Stripewidth," *IEEE Journal of Quantum Electronics*, 1981, vol. QE-17, pp. 781-787.

H. Kawanishi et al., "Effects of $(NH_4)_2S$ Treatments on the Characteristics of AlGaAs Laser Diodes," Proceedings of the 21st Conference on Solid State Devices and Materials, 1989, pp. 337-340.

R. N. Nottenburg et al., "Hot-Electron InGaAs/InP Heterostructure Bipolar Transistors with $f_T$ of 110 GHz," *IEEE Electron Device Letters*, 1989, vol. 10, pp. 30-32.

L. F. DeChiaro et al., "An experimental and theoretical investigation of degradation in semiconductor lasers resulting from electrostatic discharge," in *Semiconductor Device Reliability*, eds. Christou et al., NATO ASI SERIES E: Applied Sciences, vol. 175, pp. 379-412, Kluwer: 1989.

L. F. DeChiaro, "Damage-Induced Spectral Perturbations in Multilongitudinal-Mode Semiconductor Lasers," *Journal of Lightwave Technology*, 1990, vol. 8, pp. 1659-1669.

*Primary Examiner*—Brian E. Hearn
*Assistant Examiner*—Linda J. Fleck
*Attorney, Agent, or Firm*—Leonard Charles Suchyta; Charles S. Guenzer

[57] ABSTRACT

A method for imnproving the reliability of InGaAsP lasers in which the lasers are subjected to sulfide passivation so as to passivate defects on their facets. The lasers are then tested to determine whether any laser has an internal defect. For examples, all lasers can be tested at an electrostatic discharge (ESD) level which would cause any laser having an internal defect to fail. Failed lasers are discarded. The passivation greatly increases the ESD failure level for facet defects, and the ESD screening removes those lasers having internal defects. Thereby, those lasers remaining in the lot have greatly increased reliability to ESD.

9 Claims, 3 Drawing Sheets

SEMICONDUCTOR LASER PASSIVATION AND OVERSTRESSING

FIELD OF THE INVENTION

This invention relates generally to semiconductor lasers. In particular, the invention relates to a method of fabricating and screening semiconductor lasers such that they exhibit improved resistance to damage from electrostatic discharge.

BACKGROUND ART

Communication networks of the future will increasingly rely upon optical fibers as the transmission medium. In such a system, an electrical data signal modulates a laser optically coupled to the input end of the fiber. An optical detector at the fiber's output end reconverts the optical signal to an electrical signal. For moderately long distance transmission, the optical wavelength is chosen to fall in the frequency bands around 1.3 and 1.55 $\mu$m, which contain the spectral windows for which silica fibers exhibit low optical loss. Heterojunction semiconductor lasers of the InGaAsP material family are under extensive development for such use since they emit in the desired spectral range.

Several types of semiconductor lasers are being considered, one of which is a ridge-waveguide laser 10 illustrated in the side view of FIG. 1. An active layer 12 of n-type InGaAsP is epitaxially formed on a substrate 14 of p-type InP. An n+-type layer 16 of InP is epitaxially deposited over the active layer 12, and its upper surface is formed into a ridge 18 extending along an optical axis perpendicular to the illustration. The surface of the n+-type layer 16 away from the ridge 18 is covered with an insulating layer 20 of $SiO_2$. A gold contact layer 22 covers the upper surface but is electrically connected to only the ridge 18. A wafer having multiple replicates of this structure is cleaved at two planes perpendicular to the optical axis so as to form an optical cavity having two facets at the cleaved planes, only one facet 24 being illustrated. Leads 26 and 28 are connected to the gold layer 22 and the substrate 14. A diode is formed at the active layer 12. When the leads 26 and 28 apply a positive voltage to the p-type substrate relative to the n+-type layer 16, the diode is forward biased and lasing light is generated in a lasing region 30 in and near the active layer 12 beneath the ridge 18. The opposite polarity of applied voltage is referred to as reverse bias. The ridge 18 also provides index guiding of the lased light along an optical axis extending along the ridge 18 in a direction perpendicular to the illustration and extending through the illustrated facet 24 of the chip. That facet 24 is designed to have a small but finite optical transmission while the unillustrated opposed facet should have as low a transmission as possible. Thereby, lasing is achieved. This type of laser 10 is described only as an example; the following remarks apply to other types of lasers as well.

If these lasers are to be employed in the telephone network, where such lasers need to be fielded in large numbers and in sometimes remote locations, they need to be extremely reliable. Sim et al. provide a general discussion on this topic in "Reliability testing of optoelectronic components," *British Telecommunications Technology Journal*, volume 4, 1986, pp. 104–113. Semiconductor lasers of the AlGaAs material family, which are used for the 0.8 $\mu$m silica transmission window, have been well characterized and are known to be susceptible to formation of dark-line defects and degradation of facets. On the other hand, InGaAsP lasers are less well characterized and are believed to be less susceptible although vulnerability has been predicted. Ueda has reported in "Degradation of III–V Optoelectronic Devices," *Journal of the Electrochemical Society*, volume 135, 1988, pp. 11C–21C that a failure mechanism in AlGaAs lasers is caused by defects at the facets 24, which then propagate into the interior of the lasers at high laser power levels. However, he reported that such failure mode does not exist in InGaAsP. He also ascribed the dark-line defect to dislocations and other defects in and adjacent to the active lasing region 30. Again, he failed to detect such defects in InGaAsP. Peek also discusses facet erosion in AlGaAs lasers in "Water Vapor, Facet Erosion, and the Degradation of (al,Ga)As DH Lasers Operated at CW Output Powers of Up to 3 mW/$\mu$ Stripewidth," *Journal of Quantum Electronics*, volume QE-17, 1981, pp.781–787. His discussion about InGaAsP is very general, but he predicts less susceptibility.

One of the present inventors together with others originated a sulfide passivation technique for bipolar transistors of GaAs and other III–V compounds, as disclosed in U.S. Pat. Nos. 4,751,200 and 4,751,201. Kawanishi et al. have applied this sulfide passivation to the facets of an AlGaAs semiconductor laser, as disclosed in "Effects of $(NH_4)_2S$ Treatments on the Characteristics of AlGaAs Laser Diodes," *Proceedings of the 21st Conference on Solid State Devices and Materials*, Tokyo, Japan, 1989, pp. 337–340. The passivation allows higher drive currents without catastrophic failure. The passivation was motivated by a desire to reduce facet degradation. The usefulness of these results in InGaAsP is cast into doubt by the statement of Nottenburg et al. that the surface recombination of InGaAs is orders of magnitude less than that of GaAs. See "Hot-electron InGaAs/InP heterostructure bipolar transistors with $f_r$ of 110 GHz," *IEEE Electron Device Letters*, volume 10, 1989, pp.30–32.

Summary of the Invention

Accordingly, an object of the invention is to provide a highly reliable InGaAsP semiconductor laser.

A further object is to provide a screening method to eliminate those semiconductor lasers that may fail.

The invention can be summarized as a method of improving the reliability of InGaAsP semiconductor lasers. The facets of the laser are sulfide passivated. Then, the lasers are tested for the existence of internal defects, e.g., by electrical pulse testing at a voltage level significantly above that causing failure due to internal defects. Failed lasers are removed from the population.

DETAILED DESCRIPTION OF THE PREFERRED EMBODIMENTS

We have found that the sulfide passivation procedure can be beneficially applied to InGaAsP lasers. Such treatment raises the electrostatic discharge failure levels for at least one failure mode, believed to be the mode in which the facet degrades, to such a high level that the remaining failure modes can be screened by an electrostatic discharge test or other screening method.

The invention was verified in a series of tests using commercial, ridge-waveguide InGaAsP lasers. They all emitted in the 1.3μm window. All lasers were mounted on submounts but were otherwise unpackaged. Forward-biased ESD stressing was performed by applying five pulses from an IMCS model 2400C simulator. The pulse heights began at 500 volts and were then increased at 100 or 200 volt increments. Their pulse widths were 150 ns. After each series of five pulses, the lasers were tested for forward-biased light versus current and reverse-biased current versus voltage following the procedure described by DeChiaro et al. in "An experimental and theoretical investigation of degradation in semiconductor lasers resulting from electrostatic discharge," in *Semiconductor Device Reliability* (Christou et al., eds), NATO ASI SERIES E: Applied Sciences, volume 175, pp. 379-412 (Kluwer Academic Publ., 1989). Failure was defined as a 50% increase in the lasing threshold voltage. No testing was performed beyond 10,000 V, the limit of the simulator.

EXPERIMENT 1

A first control group of lasers were forward stressed after chemical treatment. The ESD failures for the lasers, as illustrated in the failure distribution chart of FIG. 2, assumed a bimodal distribution. Many of the failures clustered around 400 V to 2 kV, while many other failures clustered around 8 and 9 kV. Further tests demonstrated that the failures occurring at the lower voltages were caused by internal defects, absorption, or scattering centers located within the bulk material of the lasers. These defects could be identified, prior to stress failure, by inspecting the laser spectra using a defect distribution scan, as disclosed by DeChiaro in "Damage-Induced Spectral Perturbations in Multilongitudinal-Mode Semiconductor Lasers," *Journal of Lightwave Technology*, volume 8, 1990, pp. 1659-1669. In this method, the lasing optical spectrum is measured as a function of wavelength. The envelope of the spectrum should follow a Lorentzian line shape. Lasers having spectra significantly departing from a Lorentzian line shape are judged to have significant internal defects.

EXPERIMENT 2

Figure 3:
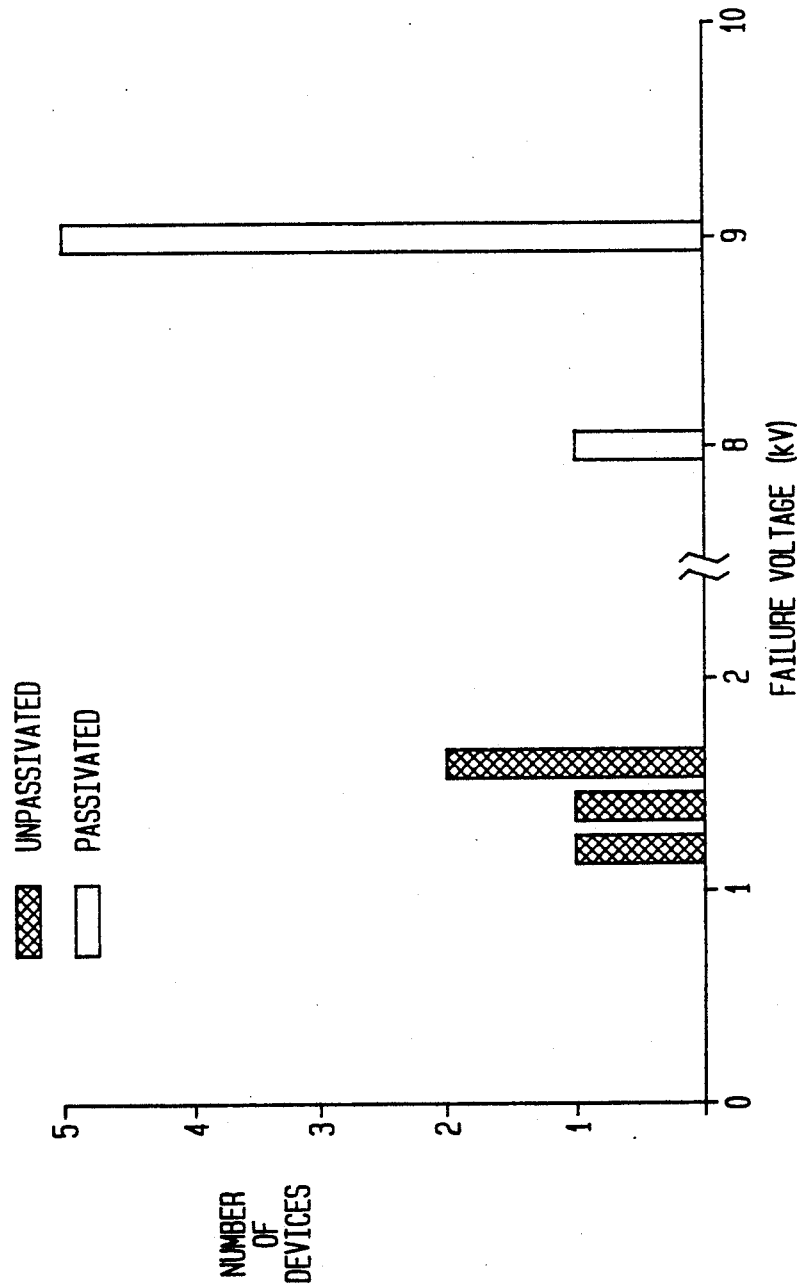
FIG. 3 is a distribution chart of the electrostatic discharge failure levels for screened lasers showing the beneficial effects of the invention.

A second control group of lasers were screened for the bulk defects on the basis of the laser spectra. Then, without any chemical treatment, they were forward stressed. Their ESD failures are illustrated by the cross-hatched areas in the failure distribution chart of FIG. 3. The unpassivated second control group exhibited a mean failure of 1450 V and a standard deviation of 190 V. Analysis indicated that these lasers had failed from catastrophic optical damage.

Experiment 3

A third group of lasers were screened for the bulk defects. They were then chemically passivated by immersing them in $(NH_4)_2S_x (x=0.1-0.2)$ aqueous solution for 30 to 60 second and then drying them in a jet of nitrogen. Both of the opposed facets had been cleaved and similarly processed and were exposed to the sulfide passivation. Only after passivation were the lasers ESD stressed. Their experimental failure levels are illustrated by the unhatched areas in the failure distribution chart of FIG. 3. In fact, the lasers shown at 9 kV actually survived beyond this level, the upper limit of the ESD simulator. In any case, the lasers passivated according to our invention had their failure levels significantly raised beyond the failure levels for unpassivated lasers.

Figure 1:
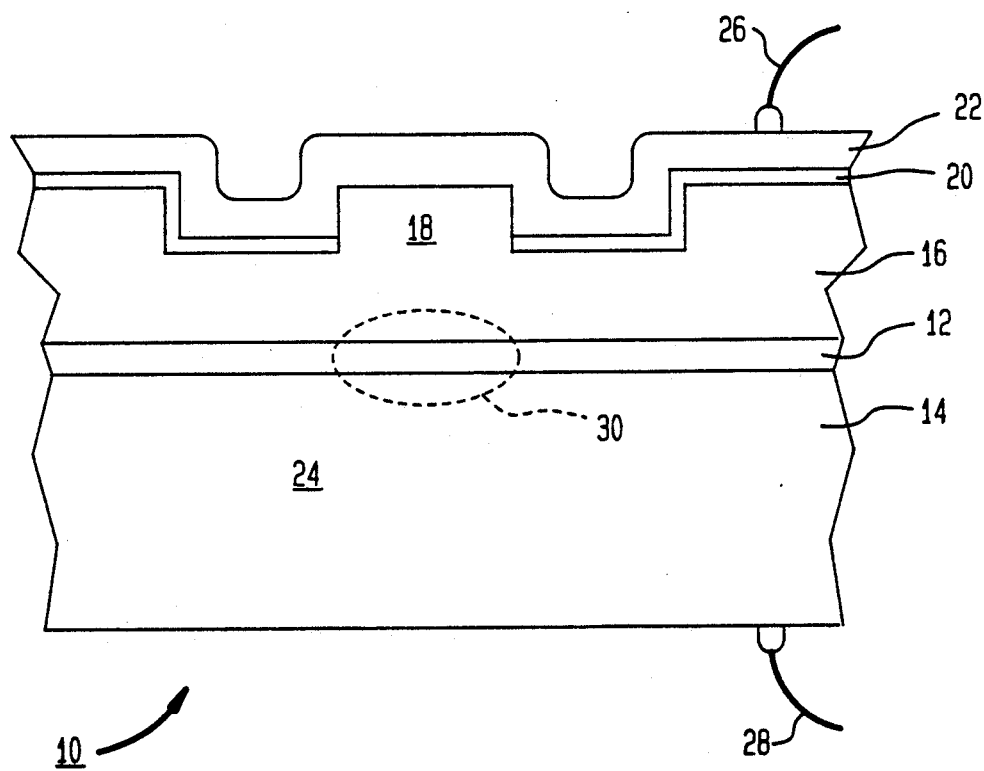
FIG. 1 is a perspective view of an exemplary edge-emitting, ridge-waveguide semiconductor laser with which the method of the invention can be used.
Figure 2:
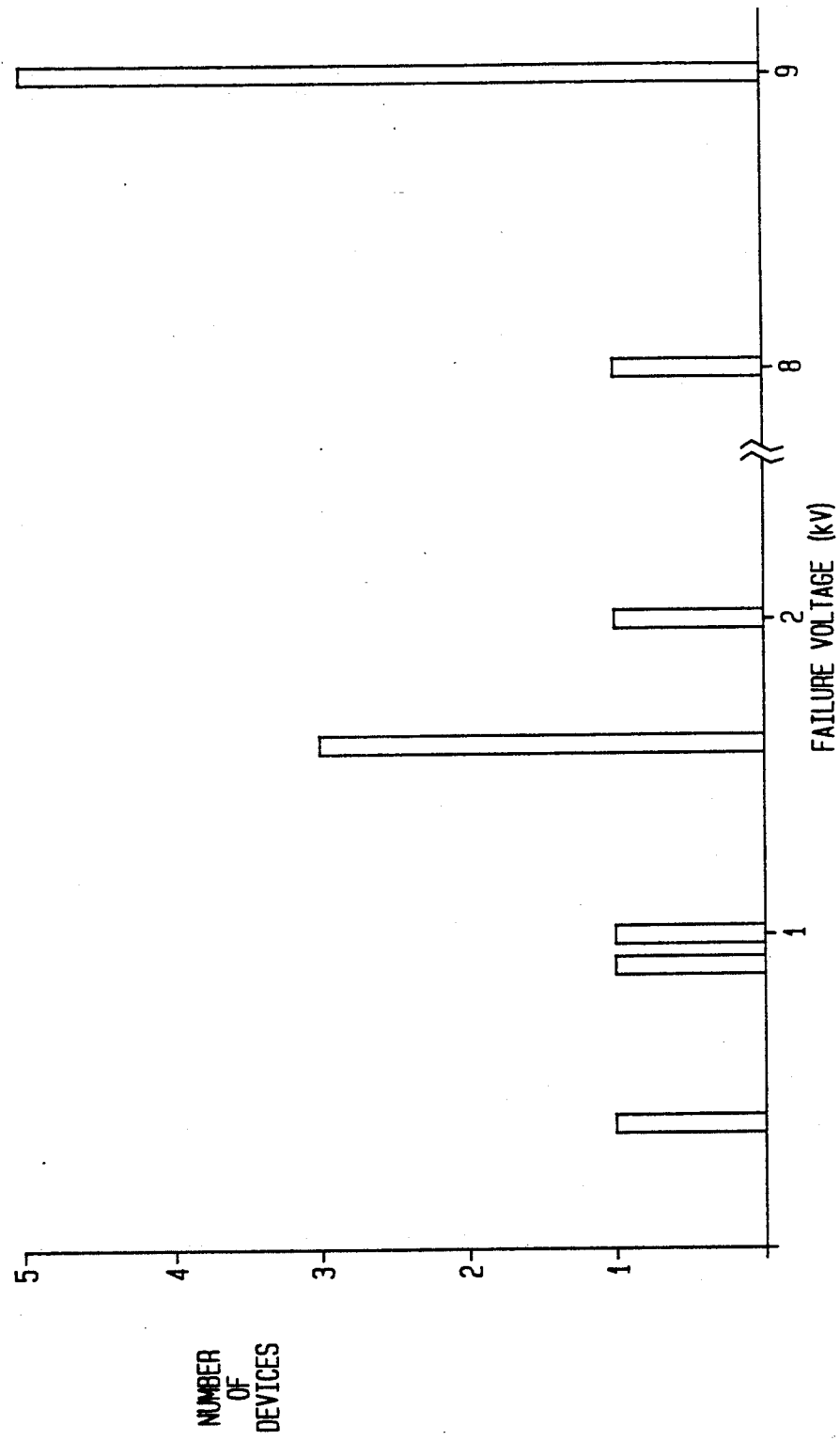
FIG. 2 is a distribution chart of the electrostatic discharge failure levels for passivated but unscreened lasers.

FIG. 2 shows that failures for passivated lasers occur n a bimodal distribution. There are a few failure occurring below 3 or 4 kV. The remaining failures are at 8 kV and above. Thus it appears clear that the passivation has minimal effect on one failure mode. However, for another failure mode, the passivation greatly increased the failure level. Indeed, for at least the types of tested lasers, the failure mode for the upper failure level, which can be removed by passivation, is the numerically dominant one.

An analysis of the spectral data revealed that the low-level failures of the passivated lasers occurred in lasers that did not produce a lasing output with a good Lorentzian spectral shape either before or after stressing. Such distorted spectral shapes are associated with internal defects near the laser's active region. If the lasers with the optically determined defects were removed from the population, the low-level ESD failure mode in FIG. 2 is removed. It is assumed that the high-level ESD failure mode is associated with facet damage. The sulfide treatment would passivate the surface states at the facet which provide either a current path or nucleation side for catastrophic optical damage during ESD. The ESD current or absorbed light would heat the facet surface and cause any defects to propagate.

In view of these results, sulfide passivation clearly improves the reliability of lasers under one failure mode. The lasers can be tested for the other failure mode by monitoring their optical line shapes. However, in a production environment, such optical testing is time-consuming. Accordingly, it is preferable to first passivate the production lot of lasers and then to perform the ESD testing to a level which causes the low-level failures to occur. Those lasers which fail the ESD test are removed from the production lot. Such testing can be performed prior to packaging and optical alignment.

The testing level should be determined for each type of laser having a significantly different structure and production environment. The bimodal distribution can be determined for unscreened, passivated lasers. The identification of the lower-level failures with internal defects can be verified by measuring the lasing spectra for those lasers. The testing level should be significantly below the failure level for passivated lasers. For the lasers of FIG. 3, the appropriate low-level ESD testing level would be 3 to 6 kV. In general, the ESD testing level would be about twice the upper limit of the failure level associated with internal laser defects.

What is claimed is:

1. A method of passivating and screening semiconductor lasers, comprising the steps of:
    determining an electrostatic discharge failure level associated with internal defects of a type of InGaAsP semiconductor lasers;

sulfide passivating a plurality of said type of lasers having at least one exposed end facet, said plurality constituting a lot;

electrostatic discharge stressing said plurality of lasers to a stressing corresponding to said failure level;

testing each of said stressed lasers to determine whether it is a failed laser; and removing each said failed laser from said lot.

2. A method as recited in claim 1, wherein said electrostatic discharge stressing comprises applying a forward-bias pulse to said lasers.

3. A method as recited in claim 2, wherein said stressing level is above a stress failure level associated with said internal defects and is below a stress failure level of said type of lasers after sulfide passivation.

4. A method as recited in claim 2, wherein said forward-bias pulse has a voltage above 4 kV.

5. A method as recited in claim 4, wherein said voltage of said forward-bias pulse is below 6 kV.

6. A method as recited in claim 1, wherein said InGaAsP lasers emit at a wavelength between 1.3 and 1.55 $\mu$m.

7. A method of screening lasers, comprising the steps of:

sulfide passivating at least one exposed facet of a plurality of InGaAsP semiconductor lasers, said plurality constituting a lot;

measuring a lasing optical output spectrum for each of said lasers in said lot; and comparing said measured spectrum to a reference spectrum for each of said lasers in said lot and removing any of said lasers from said lot if its measured spectrum does not adequately conform to said reference spectrum.

8. A method as recited in claim 7, wherein said measuring step is performed prior to said sulfide passivating step.

9. A method as recited in claim 7, wherein said measuring step is performed after said sulfide passivating step.

* * * * *

UNITED STATES PATENT AND TRADEMARK OFFICE
CERTIFICATE OF CORRECTION

PATENT NO.  : 5,116,767

DATED       : May 26, 1992

INVENTOR(S) : Louis F. DeChiaro and Claude J. Sandroff

It is certified that error appears in the above-identified patent and that said Letters Patent is hereby corrected as shown below:

```
     In the Abstract, line 1, "imnproving" should read --improving--.
Column 2, line 18, "(al,Ga)" should read (Al,Ga)--;
          line 42, "f_r" should read --f_T--.
Column 4, line 14, "n" should read --in--,
          line 14, "failure" should read --failures--.
Column 5, line 6, "stressing corresponding" should read --stressing
     level corresponding--.
```

Signed and Sealed this

Seventh Day of September, 1993

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,116,767  
APPLICATION NO. : 07/754740  
DATED : May 26, 1992  
INVENTOR(S) : Louis F. DeChiaro and Claude J. Sandroff Page 1 of 1

It is certified that error appears in the above-identified patent and that said Letters Patent is hereby corrected as shown below:

ON THE FACE OF THE PATENT

In the "Filed" category, under "Appl. No.: 754,740":

Delete "Sep. 9, 1991" and replace with -- Sep. 4, 1991 --.

Signed and Sealed this

Thirteenth Day of October, 2009

David J. Kappos
*Director of the United States Patent and Trademark Office*